United States Patent
Chen et al.

(10) Patent No.: US 7,524,616 B2
(45) Date of Patent: Apr. 28, 2009

(54) APPLICATIONS OF SEMICONDUCTOR NANO-SIZED PARTICLES FOR PHOTOLITHOGRAPHY

(75) Inventors: Zhiyun Chen, Alexandria, VA (US); Erin F. Fleet, Springfield, VA (US); Gregory Cooper, Alexandria, VA (US)

(73) Assignee: Pixelligent Technologies LLC, College Park, MD (US)

( * ) Notice: Subject to any disclaimer, the term of this patent is extended or adjusted under 35 U.S.C. 154(b) by 600 days.

(21) Appl. No.: 10/792,377

(22) Filed: Mar. 4, 2004

(65) Prior Publication Data

US 2009/0081594 A1    Mar. 26, 2009

Related U.S. Application Data

(60) Provisional application No. 60/451,240, filed on Mar. 4, 2003.

(51) Int. Cl.
*G03F 7/26* (2006.01)
*G03F 7/20* (2006.01)

(52) U.S. Cl. ...................................... 430/311; 430/322
(58) Field of Classification Search .................. 430/322
See application file for complete search history.

(56) References Cited

U.S. PATENT DOCUMENTS

| | | | |
|---|---|---|---|
| 4,253,728 A | 3/1981 | Venkatesan et al. | |
| 5,187,715 A | 2/1993 | Weisbuch et al. | |
| 5,281,840 A | 1/1994 | Sarma | |
| 6,005,707 A | 12/1999 | Berggren et al. | |
| 6,291,110 B1 | 9/2001 | Cooper et al. | |
| 6,440,637 B1 * | 8/2002 | Choi et al. | 430/296 |
| 6,455,103 B1 | 9/2002 | Mennig et al. | |
| 6,819,845 B2 | 11/2004 | Lee et al. | |
| 6,826,144 B1 | 11/2004 | Ichihara et al. | |
| 6,927,002 B2 * | 8/2005 | Hattori et al. | 430/5 |
| 2002/0027647 A1 | 3/2002 | Cooper et al. | |
| 2002/0182541 A1 * | 12/2002 | Gonsalves | 430/287.1 |
| 2003/0117598 A1 | 6/2003 | Case et al. | |
| 2003/0129545 A1 | 7/2003 | Kik et al. | |
| 2004/0152011 A1 | 8/2004 | Cyen et al. | |
| 2005/0173682 A1 * | 8/2005 | Zhang et al. | 252/582 |

FOREIGN PATENT DOCUMENTS

CN    1303358 A    7/2001

(Continued)

OTHER PUBLICATIONS

Ooki, Hiroshi et al., "Experimental study on non-linear multiple exposure method," SPIE vol. 3051, pp. 85-93, Santa Clara, California (Mar. 12-14, 1997).

(Continued)

*Primary Examiner*—Kathleen Duda
*Assistant Examiner*—Brittany Raymond
(74) *Attorney, Agent, or Firm*—Nixon & Vanderhye PC

(57) ABSTRACT

Semiconductor nano-sized particles possess unique optical properties, which make them ideal candidates for various applications in the UV photolithography. In this patent several such applications, including using semiconductor nano-sized particles or semiconductor nano-sized particle containing materials as highly refractive medium in immersion lithography, as anti-reflection coating in optics, as pellicle in lithography and as sensitizer in UV photoresists are described.

25 Claims, 4 Drawing Sheets

FOREIGN PATENT DOCUMENTS

| | | | |
|---|---|---|---|
| JP | 2001-057329 | * | 2/2001 |
| WO | WO 03/009058 A2 | | 1/2003 |

OTHER PUBLICATIONS

Shibuya, Masato et al., "Performance of Resolution Enhancement Technique Using Both Multiple Exposure and Nonlinear Resist," Jpn. J. Appl. Phys. vol. 33 (1994), pp. 6874-6877, Part I, No. 12B (Dec. 1994).

Brus, L.E,. J. Chem. Phys., 79(11), "A simple model for the ionization potential, electron affinity, and aqueous redox potentials of small semiconductor crystallites," 5566-71 (Dec. 1, 1983).

Efros, Al.L et al., "Interband absorption of light in a semiconductor sphere," Sov. Phys. Semicon.,16:772-78 (Jul. 1982).

Empedocles, S.A. et al., "Quantum-Confined Stark Effect in Single CdSe Nanocrystallite Quantrun Dots," Science, 278, 2114 (Dec. 19, 1997).

Gribkovskii, P., V.A. Zyulkov, A.E. Kazachenko, and S.A. Tikhomirov, "*Optical/Nnonlinearity of Semiconductor Microcrystal $CdS_xSe_{1-x}$ Under the Action of Picosecond and Nanosecond Llaser Pulses*", 1988, Phys. Stat. Sol. (b) 158: 359-66.

Kageshima, H. et al., "InGaAs/GaAs photorefractive multiple quantum well device in quantum confined Stark geometry." Appl. Phys. B 72, 685-689(2001).

Kornowski, A. et al., "*Preparation and Photophysics of Strongly Luminescing $Cd_3P_2$ Quantum Dots*", J. Phys. Chem, 1996, 100: 12467-71.

Murray, C.B. et al., "*Sythesis and Characterization of Monodisperse Nanocrystals and Closed-Packed Nanocyrstal Assemblies*," Annu. Rev. Mater. Sci., 30:545-610 (2000).

Nagase, et al., "Super-Resolution Effect of Semiconductor-Doped Glass," Jpn. J. Appl. Phys. vol. 38 (1999), pp. 1665-1668, Part 1, No. 3B (Mar. 1999).

Noharet, Bertrand, "Harnessing light with semiconductor Spatial Light Modulators," Aperturen—Surfaces and Imaging, vol. 1-2001, pp. 12-13, XP002363385 (2001).

Nomura, S. et al., "*Clearly resolved exciton peaks in $CdS_xSe_{1-x}$ microcrystallites by modulation spectroscopy*", Sol. Stat. Comm., 73: 425-9 (1990).

Scalfani, A. et al., "Effect of silver deposits on the photocatalytic activity of titanium dioxide samples for the dehydrogenation or oxidation of 2-propanol," J. Photochem. Photobiol. A: Chem. 1991, 59, 181.

Zimin, L.G. et al., "*Room-temperature Optical Nonlinearity in Semiconductor-doped Glasses*", Phys. Stat. Sol. (b) 150:653-6 (1988).

Kambe et al., "Refractive Index Engineering of Nano-Polymer Composites," NanoGram Corporation, Fremont, CA and SRI International, Chemical Science and Technology Lab, Menlo Park, CA (Spring 2001).

Office Action issued in corresponding Chinese Patent Application 200480012054.4, including English language translation (Oct. 31, 2008).

* cited by examiner

APPLICATIONS OF SEMICONDUCTOR NANO-SIZED PARTICLES FOR PHOTOLITHOGRAPHY

CROSS-REFERENCES TO RELATED APPLICATIONS

This application claims the benefit of priority from provisional application No. 60/451,240 filed Mar. 4, 2003, incorporated herein by reference.

This application is related to U.S. Pat. No. 6,291,110 B1, Cooper et al. entitled "Photolithographic System For Exposing A Wafer Using A Programmable Mask"; and commonly-assigned provisional application No. 60/431,735, filed Dec. 9, 2002 entitled "Programmable photolithographic mask and reversible photo-bleachable materials based on nano-sized semiconductor particles and their applications" to Z. Chen et. al.

FIELD

This technology herein relates to photolithography, and more particularly to applications of semiconductor nano-sized particles in photolithography, and even more particularly to applications of semiconductor nano-sized particles as highly refractive media in immersion lithography, as anti-reflection coating, as pellicle, and as sensitizer in UV photoresists.

STATEMENT REGARDING FEDERALLY SPONSORED RESEARCH OR DEVELOPMENT

Not applicable.

BACKGROUND AND SUMMARY

Lithography

Generally, lithography is used to transfer a specific pattern onto a surface. Lithography can be applied to transfer a variety of patterns including, for example, painting, printing, and the like. More recently, lithographic techniques have become widespread for use in "microfabrication"—a major (but non-limiting) example of which is the manufacture of integrated circuits such as computer chips.

In a typical microfabrication operation, lithography is used to define patterns for miniature electrical circuits. Lithography defines a pattern specifying the location of metal, insulators, doped regions, and other features of a circuit printed on a silicon wafer or other substrate. The resulting circuit can perform any of a number of different functions. For example, an entire computer can be placed on a chip.

A primary lithography system includes a wafer stepper, a photomask and photoresist. A wafer stepper generally consists of a ultraviolet (UV) light source, a photomask holder, an optical system for projecting and demagnifying the image of the mask onto a photoresist-coated wafer, and a stage to move the wafer. Conventional lithography also generally requires a photomask—a quartz substrate with chrome patterns on one surface. The chrome patterns form a perfect master of the pattern to be inscribed on one layer of a chip. Also it requires photoresist to receive the light pattern generated by the mask.

Improvements in lithography have been mainly responsible for the explosive growth of computers in particular and the semiconductor industry in general. The major improvements in lithography are mainly a result of a decrease in the minimum feature size (improvement in resolution). This improvement allows for an increase in the number of transistors on a single chip (and in the speed at which these transistors can operate). For example, the computer circuitry that would have filled an entire room in 1960's technology can now be placed on a silicon "die" the size of a thumbnail. A device the size of a wristwatch can contain more computing power than the largest computers of several decades ago.

The resolution of a photolithography system is described by the Rayleigh equation:

$$d = k_1 \lambda / NA$$

where d is the minimum feature size, $\lambda$ is the wavelength, NA is the numerical aperture of the optical system and $k_1$ is a constant determined by a specific system. For a certain wavelength and a certain optical design, the only way to improve the resolution is to increase the numerical aperture. The numerical aperture is defined as:

$$NA = n \sin \theta$$

where n is the refraction index of the relative medium and $\theta$ is the half angle of the cone of rays received by the entrance pupil. High NA indicates high light collecting or light focusing power. It is rather straightforward to see that the resolution is proportional the refractive index of the medium.

Semiconductor Nano-Sized Particles

Nano-sized particles are loosely defined as powders with small diameters for example ranging from a few hundred nanometers or less down to a few angstroms. Since they have generally only been the focus of research in the last two decades, there is little standardization, and they take many different names including quantum dot, quantum sphere, quantum crystallite, nano-crystal, micro-crystal, colloidal particle, nano-cluster, Q-particle or artificial atom. Due to their small size, they often possess dramatically different physical properties compared to their bulk counterparts. Nano-sized particles have a wide range of applications including metallurgy, chemical sensors, pharmaceuticals, painting, and cosmetics. As a result of the rapid development in synthesis methods in the last two decades, they have now entered into microelectronic and optical applications. Nano-sized particles with sizes less than 5 nm have been synthesized from a variety of semiconductors, examples include C, Si, Ge, CuCl, CuBr, CuI, AgCl, AgBr, AgI, $Ag_2S$, CaO, MgO, ZnO, ZnS, HgS, ZnSe, CdS, CdSe, CdTe, HgTe, PbS, BN, AlN, GaN, GaP GaAs, GaSb, InP, InAs, $In_xGa_{1-x}As$, SiC, $Si_{1-x}Ge_x$, $Si_3N_4$, ZrN, $CaF_2$, $YF_3$, $Al_2O_3$, $SiO_2$, $TiO_2$, $Cu_2O$, $Zr_2O_3$, $SnO_2$, $YSi_2$, $GaInP_2$, $Cd_3P_2$, $Fe_2S$, $Cu_2S$, $CuIn_2S_2$, $MoS_2$, $In_2S_3$, $Bi_2S_3$, $CuIn_2Se_2$, $In_2Se_3$, $HgI_2$, $PbI_2$, Lanthanoids oxides, etc. They have revealed very interesting optical properties.

Semiconductor materials have the so called bandgaps. The electron band below the bandgap is call valence band (VB) and the electron band above the bandgap is called conduction band (CB). The manifestation of a bandgap in optical absorption is that only photons with energy larger than the bandgap are absorbed. A photon with sufficient energy excites an electron from the top of valence band to the bottom of conduction band, leaving an empty state, a hole, at the top of the valence band.

There are several major advantages of using semiconductor nano-sized particles in photolithography. First, the bandgap of semiconductor nano-sized particles can be tailored by their size. In a certain range the smaller the size, the larger the bandgap. The bandgap determines the working wavelength.

Second, the refractive index can be very high near the bandgap. Actually some semiconductors have the highest refractive indices. For example wurzite $TiO_2$ has a refractive index of 2.4, and wurzite GaN has a refractive index about 2.6 near the bandgap. The refractive indices of common optical materials such as fused silica and quartz used in the UV lithography are around 1.5. This high refractive index is desirable for highly refractive medium immersion lithography and optical coating.

Third, nano-sized particles can be easily coated onto optics or wafers in the form of a thin film. They are, therefore, very simple to handle and produce much less contamination. Because of the polycrystalline nature of nano-sized particle films, there is less concern about matching the thermal expansion coefficients between the coating and the optics. Applying nano-sized particles by coating provides least disturbance to the existing lithography system.

Fourth, semiconductors nano-sized particles can reach sizes much smaller than the working wavelength. Currently, a large number of semiconductors can be fabricated into nano-sized particles smaller than 5 nm in diameter. Hence the scattering from the nanoparticles is negligible and size fluctuation of nano-sized particles does not affect the final scattered and transmitted light.

Fifth, in a broad sense semiconductors can possess bandgaps as high as 12 eV, corresponding to a wavelength of 100 nm. For 157 nm lithography and beyond, few materials can withstand the radiation except certain semiconductors. Nano-sized particles offer a solution for the optics in these wavelengths.

Lastly, many semiconductor nano-sized particles can be produced rather inexpensively. Therefore, the overall cost will likely be lower than conventional methods.

We propose several applications of semiconductor nano-sized particles in lithography. Such as highly refractive medium in immersion lithography, optical coating, pellicle material, and sensitizer in photoresists.

BRIEF DESCRIPTION OF THE DRAWINGS

These and other features and advantages will be better and more completely understood by referring to the following detailed description of presently preferred illustrative embodiments in conjunction with the drawings, of which.

DETAILED DESCRIPTION OF PRESENTLY PREFERRED EXAMPLE ILLUSTRATIVE NON-LIMITING IMPLEMENTATIONS

It is shown in the Rayleigh equation that the resolution of a lithography system is proportionally dependant on the refractive index of the relevant medium. There are several examples of achieving high resolution by immersion in high refractive index liquid materials. However, the fact that all liquids used in the liquid immersion lithography have refractive index smaller than 1.5 limits the final achievable resolution. Solid immersion lithography has been proposed to achieve higher refractive index.

Nano-sized particles, as mentioned before, could offer much higher refractive indices. Therefore, nano-sized particles, or mixtures of nano-sized particles with certain liquid, polymer, gel or solid material can improve the resolution in both liquid and solid immersion lithography.

Figure 1:
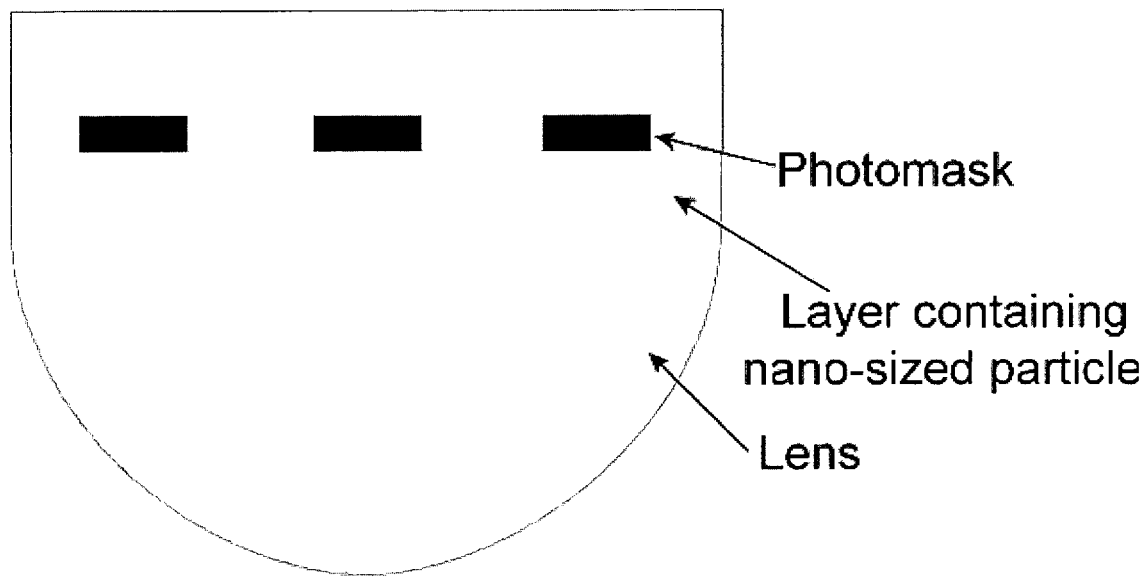
FIG. 1 shows an exemplary illustrative non-limiting optical structure to achieve high resolution by inserting a layer of high refractive index semiconductor nano-sized particle layer between the photomask and the next optics in a projection photolithography system.

A first exemplary illustrative non-limiting application of nano-sized particle as highly refractive medium in lithography is demonstrated in FIG. 1. In projection lithography, a layer containing nano-sized particles is inserted between the photomask and the immediate next lens. This layer can be coated onto either the photomask or the lens itself. For 365 nm lithography, this layer may comprise ZnO or GaN nano-sized particles. For 193 nm lithography, it may comprise $Mg_xZn_{1-x}O$ or AlN or BN nano-sized particles. The highly refractive layer has more efficiency in collecting the light transmitted through the photomask. Numerical aperture, as defined by NA=n sin θ, describes the light-gathering power of a lens. In FIG. 1, by inserting a high refractive layer between the mask and the first lens, the numerical aperture is increased by a factor of n, comparing to air. In air, NA cannot be larger than 1, while with this coating NA can easily exceed 1. For example if $TiO_2$ nano-sized particles are used, even with a NA=0.5 in air, the final NA is 1.3.

This high light collecting efficiency offers great advantages to the lithography system. First, if the geometry of the entire optical system is kept the same, this added layer will increase the final resolution by a factor of n. If the numerical aperture, i.e. the resolution, is kept the same, then the diameter of the optical system can be reduced by a factor of n and therefore the overall cost of the system can be reduced. In particularly, in programmable lithography, reduced size of optics means increase in the throughput by roughly n (see "Photolithographic System For Exposing A Wafer Using A Programmable Mask" by G. Cooper et. al., U.S. Pat. No. 6,291,110 B1).

Figure 2:
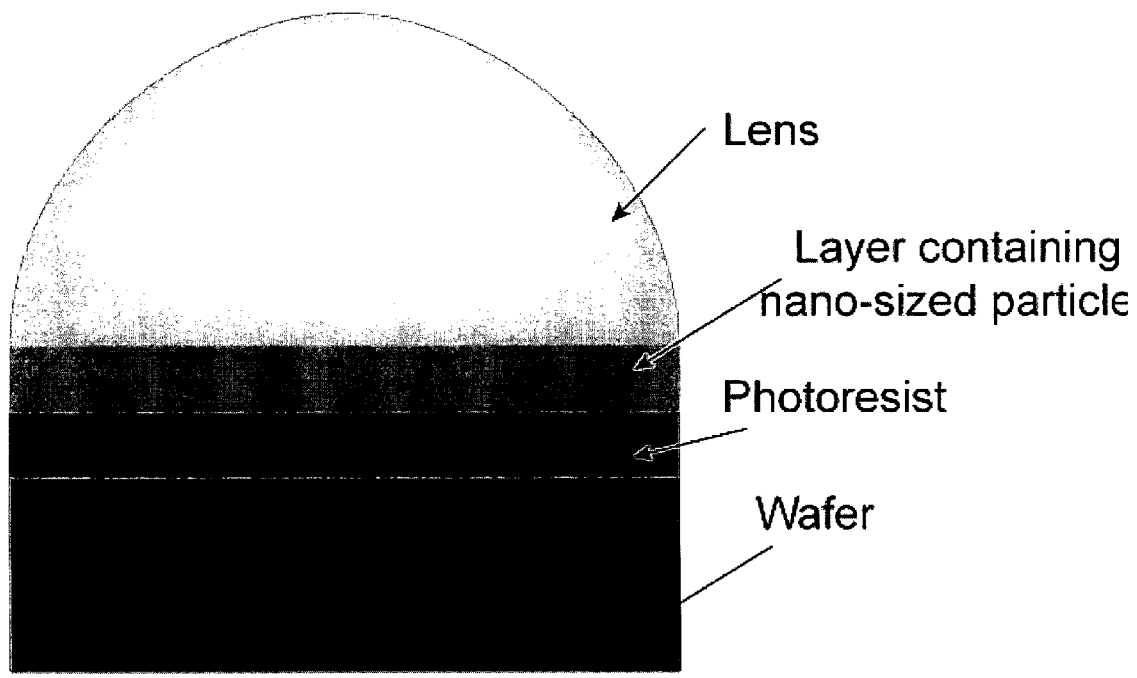
FIG. 2 shows an exemplary illustrative non-limiting optical structure to achieve high resolution by inserting a thin layer of high refractive index containing semiconductor nano-sized particle between the final optics and the photoresist in a projection photolithography system.

Another exemplary illustrative implementation is shown in FIG. 2. In this non-limiting example the high refractive index nano-sized particle containing layer is applied at the wafer end of the lithography system. A layer containing nano-sized particle is inserted between the photoresist and the exit of the projection optical system. This layer may be simply deposited or spun on top of the photoresist. This layer may also be formed by immersing the space between the final optics and photoresist with nano-sized particle containing highly refractive liquid, polymer or gel. This layer may also be formed by continuously flowing highly refractive liquid or gel through the space between the final optics and the photoresist. The highly refractive liquid may contain nano-sized particles and water. Again, as indicated by the Rayleigh equation, the resolution of the system is increased by a factor of n. For semiconductor nano-sized particles with refractive index bigger than 2.5, this can be a significant improvement.

Another exemplary illustrative non-limiting arrangement is to coat the numerical aperture limiting optics. In an imaging system the numerical aperture is usually limited by the entrance optics. In some systems, the numerical aperture may be limited by some intermediated optics. To improve the overall NA, the specific optics may be coated with highly refractive semiconductor nano-sized particles containing material.

Another exemplary illustration is to fill the entire optical system with semiconductor nano-sized particles or mixture of nano-sized particle with liquid, polymer, gel or solid. Light spreads more in the low refractive index material than in the high refractive index material, filling up the entire space with high refractive index material confines the light path to a tighter distribution. Therefore, it can reduce the diameter of the optical design further. This is particularly important to the programmable lithography because smaller optics increase the throughput, see "Photolithographic System For Exposing A Wafer Using A Programmable Mask" by G. Cooper et. al., U.S. Pat. No. 6,291,110 B1.

For certain wavelengths in lithography such as 193 nm and 157 nm, few materials can withstand the highly energetic radiation except some wide bandgap semiconductors such as MgO and AlN. The high refractive index in these semiconductors also offers certain advantages. For example, it will require less thickness to achieve certain optical path, which is defined as refractive index times the thickness. Smaller thickness in turn results in less absorption.

Figure 3:
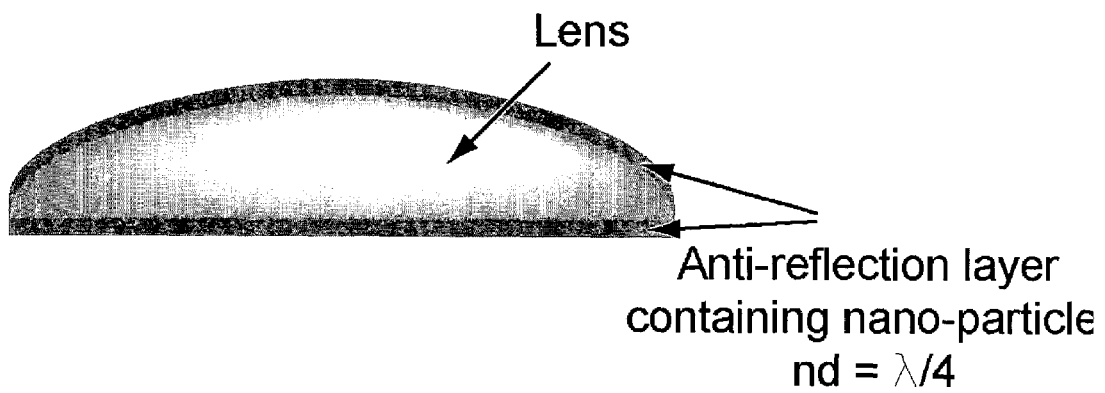
FIG. 3 shows an exemplary illustrative non-limiting anti-reflection coating for optical lens with a thickness of the coating of $\lambda/4n$ for maximum transmission.

An exemplary illustration of applying semiconductor nano-sized particles for optical coating is the anti-reflection coating of optical lenses, as demonstrated in FIG. 3. Anti-reflection coating has an optical path of a quarter of the wavelength, so the reflection is minimized. Of course, the coating material itself has to cause little or no absorption at the working wavelength. For optics working at 193 nm, Nano-sized particles such as $Mg_xZn_{1-x}O$, BN, AlN, $CaF_2$, $MgF_2$, and $SiO_2$ may be used as the coating material because they all have bandgap larger than the photon energy. For 157 nm lithography, AlN, $SiO_2$ nano-sized particles may be used. Nano-sized particles can be mixed with certain decomposable polymer matrix, spun on to the optics and then the matrix can removed through chemical processes. Nano-sized particles may also be grown directly on the optics by various know growth methods.

Another exemplary illustration is to use the semiconductor nano-sized particles as pellicle materials. A pellicle provides protection for a photomask against dust particles. The pellicle itself may be transparent to the light and have certain mechanical strength. For 193 nm pellicle, nano-sized particles such as $Mg_xZn_{1-x}O$, BN, AlN, $CaF_2$, $MgF_2$, $SiO_2$, may be used as candidate materials. For 157 nm lithography, AlN, $SiO_2$ nano-sized particles may be used as candidate materials. Few hundred micrometers of close-packed nano-sized particles may be grown on a substrate, such as thin glass plate using suitable methods. High pressure may be applied after the deposition to assure mechanical strength. Then the substrate can be etched away by selective etching, such as HF acid etching, leaving the free standing film as the pellicle.

Figure 4:
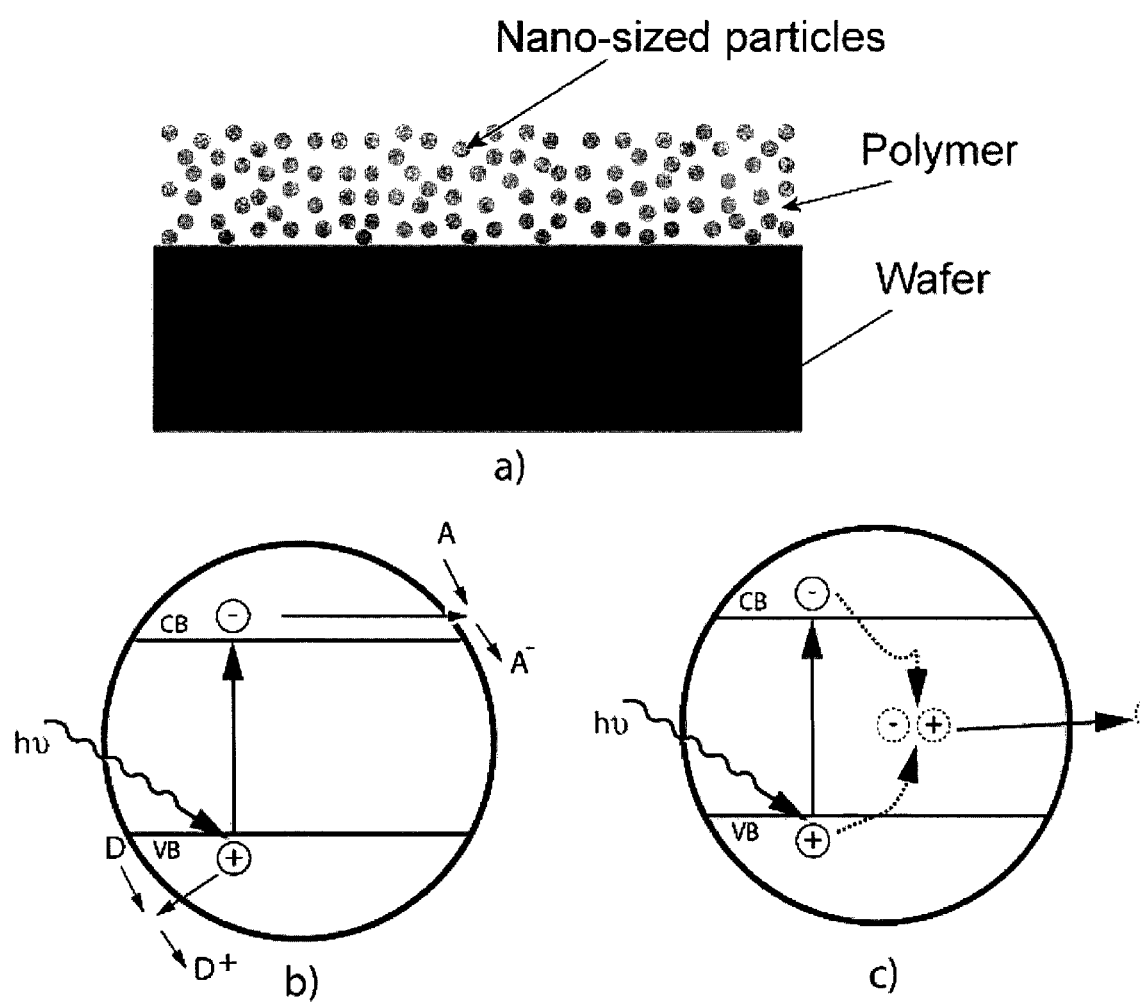
FIG. 4a is an exemplary illustrative non-limiting photoresist with semiconductor nano-sized particles as sensitizer.
FIG. 4b shows the exemplary physical process in which photo-generated electron or hole are transferred out of the particle via surface bonded acceptor or donor.
FIG. 4c demonstrates the exemplary illustrative physical process, i.e. Auger photo-ionization, in which electrons or holes are ejected out the particle as a result of the incoming photon.

An exemplary illustration of applying semiconductor nano-sized particles as a sensitizer in photoresist is shown in FIG. 4. Nano-sized particles with certain bandgap(s) are mixed with certain polymers as seen in the FIG. 4a. Upon absorption of a photon, the resulted electron or hole may be transferred out of the nano-sized particle into surrounding polymers via surface states or surface bonded acceptor or donor. The transferred electrons or holes can then break or form bonds in the polymer and alter its solubility of the polymer to developers. This type of photoresist can be used at wavelength shorter than 193 nm where it is difficult to find conventional photoresists.

If nano-sized particles are small enough, multi-body interactions such as Auger photo-ionization can be significant. As depicted in FIG. 4b, in an Auger process, a photon generates a pair of electron and hole, when the pair recombines, it transfer its energy and momentum to another electron or hole. When multiple Auger effects occur simultaneously, some of electrons or holes can gain enough energy to be ejected out of the particle into the surrounding environment. This process is described in the publication entitled "Fluorescence Intermittency In Single Cadmium Selenide Nanocrystals" to M. Nirmal et. al., Nature, 1996, 383, pp. 802-804. The ejected energetic electrons lose their energy by breaking chemical bonds of the polymers. The broken bonds in turn alter the solubility of the polymer to developer.

While the technology herein has been described in connection with exemplary illustrative non-limiting embodiments, the invention is not to be limited by the disclosure. The invention is intended to be defined by the claims and to cover all corresponding and equivalent arrangements whether or not specifically disclosed herein.

The invention claimed is:

1. A method of performing immersion photolithography comprising:
projecting light along an optical path to form a light pattern on a substrate comprising a wafer that is at least in part coated with a layer comprising photoresist, at least a portion of said light passing through (a) at least one photomask with at least one pattern, (b) at least final optics, and (c) a medium having semiconductor nano-sized particles dispersed therein, said semiconductor nano-sized particles having a refractive index higher than said medium, the semiconductor nano-sized particle dispersed medium filling up space between said final optics and said substrate;
collecting on said photoresist, a portion of said light passing through said at least one photomask, said final optics and the semiconductor nano-sized Particle dispersed medium; and
changing the solubility of said photoresist at least in part in response to said collected light pattern.

2. The method of claim 1 wherein said medium comprises a liquid, polymer or a gel.

3. The method of claim 2 wherein said light has a wavelength of 193 nm.

4. The method of claim 1 wherein said medium comprises water.

5. The method of claim 4 wherein said light has a wavelength of 193 nm.

6. The method of claim 4 wherein said light has a wavelength of 248 nm.

7. The method of claim 1 wherein the nano-sized particle dispersed medium is flowed continuously through the space between said final optics and said coated wafer.

8. The method of claim 7 wherein said medium comprises water.

9. The method of claim 7 wherein said light has a wavelength of 193 nm.

10. The method of claim 1 wherein the said semiconductor nano-sized particles are selected from the group consisting of C, Si, Ge, CuCl, CuBr, CuI, AgCl, AgBr, AgI, $Ag_2S$, CaO, MgO, ZnO, $Mg_xZn_{1-x}O$, ZnS, HgS, ZnSe, CdS, CdSe, CdTe, HgTe, PbS, BN, AlN, GaN, $Al_xGa_{1-x}N$, GaP GaAs, GaSb, InP, InAs, $In_xGa_{1-x}As$, SiC, $Si_{1-x}Ge_x$, $Si_3N_4$, ZrN, $CaF_2$, $YF_3$, $Al_2O_3$, $SiO_2$, $TiO_2$, $Cu_2O$, $Zr_2O_3$, $ZrO_2$, $SnO_2$, $YSi_2$, $GaInP_2$, $Cd_3P_2$, $Fe_2S$, $Cu_2S$, $CuIn_2S_2$, $MoS_2$, $In_2S_3$, $Bi_2S_3$, $CuIn_2Se_2$, $In_2Se_3$, $HgI_2$, $PbI_2$, Landthoids oxides, and their various alloys.

11. The method of claim 1 wherein said semiconductor nano-sized particles have bandgaps.

12. The method of claim 1 wherein said nano-sized particles are transparent at least at one of lithographic wavelengths.

13. The method of claim 1 wherein said nano-sized particles comprise nanocrystals.

14. The method of claim 1 wherein said light has a wavelength of 193 nm.

15. The method of claim 1 wherein said light has a wavelength of 157 nm.

16. The method of claim 1 wherein said light has a wavelength of 248 nm.

17. The method of claim 1 wherein said light has a wavelength of 365 nm.

18. The method of claim 1 wherein said nano-sized particles are dispersed in water and the nano-sized particle dispersed water is flowed continuously through the space between said final optics and said coated wafer; said light has a wavelength of 193 nm; and said nano-sized particles comprise nanocrystals that are transparent at 193 nm.

19. The method of claim 1 wherein said medium is a liquid, a polymer, or a gel and the nano-sized particle dispersed medium is flowed continuously through the space between said final optics and said coated wafer; said light has a wavelength of 193 nm; and said nano-sized particles comprise nanocrystals that are transparent at 193 nm.

20. The method of claim 1 wherein said nano-sized particles are dispersed in water and the nano-sized particle dispersed water is flowed continuously through the space between said final optics and said coated wafer; said light has a wavelength of 248 nm; and said nano-sized particles comprise nanocrystals that are transparent at 248 nm.

21. The method of claim 1 wherein said medium is a liquid, a polymer, or a gel and the nano-sized particle dispersed medium is flowed continuously through the space between said final optics and said coated wafer; said light has a wavelength of 248 nm; and said nano-sized particles comprise nanocrystals that are transparent at 248 nm.

22. The method of claim 1 wherein said nano-sized particles are dispersed in water and the nano-sized particle dispersed water is flowed continuously through the space between said final optics and said coated wafer; said light has a wavelength of 193 nm; and said nano-sized particles comprise nanocrystals.

23. The method of claim 1 wherein said medium is a liquid, a polymer, or a gel and the nano-sized particle dispersed medium is flowed continuously through the space between said final optics and said coated wafer; said light has a wavelength of 193 nm; and said nano-sized particles comprise nanocrystals.

24. The method of claim 1 wherein said nano-sized particles are dispersed in water and the nano-sized particle dispersed water is flowed continuously through the space between said final optics and said coated wafer; said light has a wavelength of 248 nm; and said nano-sized particles comprise nanocrystals.

25. The method of claim 1 wherein said medium is a liquid, a polymer, or a gel and the nano-sized particle dispersed medium is flowed continuously through the space between said final optics and said coated wafer; said light has a wavelength of 248 nm; and said nano-sized particles comprise nanocrystals.

* * * * *